(12) United States Patent
Oh et al.

(10) Patent No.: US 8,399,348 B2
(45) Date of Patent: Mar. 19, 2013

(54) SEMICONDUCTOR DEVICE FOR IMPROVING ELECTRICAL AND MECHANICAL CONNECTIVITY OF CONDUCTIVE PILLERS AND METHOD THEREFOR

(75) Inventors: Kwang Sun Oh, Daejeon (KR); Dong Hee Lee, Icheon (KR); Dong In Kim, Ulsan (KR); Bae Yong Kim, Jeollanam-do (KR); Jin Woo Park, Gwangju (KR)

(73) Assignee: Amkor Technology, Inc, Chandler, AZ (US)

( * ) Notice: Subject to any disclaimer, the term of this patent is extended or adjusted under 35 U.S.C. 154(b) by 0 days.

(21) Appl. No.: 13/621,076

(22) Filed: Sep. 15, 2012

(65) Prior Publication Data

US 2013/0012015 A1 Jan. 10, 2013

Related U.S. Application Data

(62) Division of application No. 12/751,842, filed on Mar. 31, 2010, now Pat. No. 8,294,265.

(51) Int. Cl.
*H01L 21/44* (2006.01)

(52) U.S. Cl. ........ 438/613; 438/612; 438/618; 438/666; 257/E21.508

(58) Field of Classification Search ................. 438/613, 438/612, 618, 666; 257/E21.508
See application file for complete search history.

(56) References Cited

U.S. PATENT DOCUMENTS

| | | | |
|---|---|---|---|
| 5,641,990 A | 6/1997 | Chiu | |
| 5,656,863 A | 8/1997 | Yasunaga et al. | |
| 5,773,889 A | 6/1998 | Love et al. | |
| 6,486,563 B1 | 11/2002 | Lin | |
| 6,620,731 B1* | 9/2003 | Farnworth et al. | 438/667 |
| 6,977,213 B1* | 12/2005 | Tsai et al. | 438/612 |
| 7,183,189 B2* | 2/2007 | Hashimoto | 438/612 |
| 7,408,241 B2* | 8/2008 | Bauer et al. | 257/623 |
| 7,517,798 B2* | 4/2009 | Tuttle | 438/667 |
| 7,554,201 B2 | 6/2009 | Kang et al. | |
| 7,615,478 B2* | 11/2009 | Salmon | 438/612 |
| 7,713,871 B2* | 5/2010 | Balucani | 438/666 |
| 7,888,177 B2* | 2/2011 | Hashimoto | 438/112 |
| 7,964,493 B2* | 6/2011 | Yamano | 438/618 |
| 2002/0127836 A1* | 9/2002 | Lin et al. | 438/612 |
| 2005/0208748 A1* | 9/2005 | Srivastava et al. | 438/613 |
| 2005/0275096 A1 | 12/2005 | Zeng et al. | |
| 2007/0026659 A1* | 2/2007 | Chinthakindi et al. | 438/612 |
| 2007/0045840 A1 | 3/2007 | Varnau | |
| 2007/0152331 A1 | 7/2007 | Kang et al. | |
| 2008/0194095 A1* | 8/2008 | Daubenspeck et al. | 438/612 |
| 2009/0108443 A1 | 4/2009 | Jiang | |
| 2009/0127703 A1 | 5/2009 | Lee | |

* cited by examiner

*Primary Examiner* — Nitin Parekh

(74) *Attorney, Agent, or Firm* — McAndrews, Held & Malloy, Ltd.

(57) ABSTRACT

A semiconductor device has a semiconductor die having a first surface and a second surface wherein at least one bond pad is formed on the first surface. A passivation layer is formed on the first surface of the semiconductor device, wherein a central area of the at least one bond is exposed. A seed layer is formed on exposed portions of the bond pad and the passivation layer. A conductive pillar is formed on the seed layer. The conductive pillar has a base portion wherein the base portion has a diameter smaller than the seed layer and a stress relief portion extending from a lateral surface of a lower section of the base portion toward distal ends of the seed layer. A solder layer is formed on the conductive pillar.

20 Claims, 5 Drawing Sheets

SEMICONDUCTOR DEVICE FOR IMPROVING ELECTRICAL AND MECHANICAL CONNECTIVITY OF CONDUCTIVE PILLERS AND METHOD THEREFOR

CROSS-REFERENCE TO RELATED APPLICATIONS/INCORPORATION BY REFERENCE

This application is a DIVISIONAL of U.S. patent application Ser. No. 12/751,842, filed Mar. 31, 2010 now U.S. Pat. No. 8,294,265. The content of the aforementioned patent application is hereby incorporated herein by reference in its entirety.

FIELD OF THE INVENTION

This invention relates to a semiconductor device and, more specifically, to a semiconductor device having conductive pillars with a stress relief portion that reduces stresses generated at ends of contact portions between the conductive pillar and a seed layer to prevent the conductive pillar and the seed layer from being disconnected from each other due to stress.

BACKGROUND OF THE INVENTION

Semiconductor devices having a chip scale package (CSP) structure are typically manufactured such that after the manufacturing process has been accomplished, a finished wafer is singulated as individual semiconductor chips. In recent years, a flip chip semiconductor device has been developed as a semiconductor having a CSP structure. A flip chip semiconductor device is manufactured by forming a conductive bump having a predetermined height on a bond pad of a semiconductor die, and may be electrically connected to an external device like a printed circuit board through the conductive bump.

However, contact portions between distal ends of a conductive bump and a semiconductor die is vulnerable to external forces. Thus, the conductive bump may be subject to considerable stresses. In such a case, electrical and mechanical properties of the flip chip semiconductor device may deteriorate.

Therefore, a need existed to provide a system and method to overcome the above problem.

SUMMARY OF THE INVENTION

A semiconductor device has a semiconductor die having a first surface and a second surface wherein at least one bond pad is formed on the first surface. A passivation layer is formed on the first surface of the semiconductor device, wherein a central area of the at least one bond is exposed. A seed layer is formed on exposed portions of the bond pad and the passivation layer. A conductive pillar is formed on the seed layer. The conductive pillar has a base portion wherein the base portion has a diameter smaller than the seed layer and a stress relief portion extending from a lateral surface of a lower section of the base portion toward distal ends of the seed layer. A solder layer is formed on the conductive pillar.

A method for manufacturing a semiconductor device, comprising: forming a passivation layer on a first surface of a semiconductor die having at least one bond pad, wherein a central area of the at least one bond pad is exposed; forming a seed layer on the passivation layer and exposed portions of the at least one bond pad; forming a photoresist layer on the seed layer; forming a first through hole and a second through hole, the first through hole formed on the photoresist layer to expose a portion of the seed layer corresponding to a region including the bond pad, and the second through hole extending from a lateral surface of a lower portion of the first through hole toward the photoresist layer; forming a conductive pillar by filling the through hole with a conductive material; forming a solder layer on the conductive pillar; and removing the photoresist layer and portions of the seed layer.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
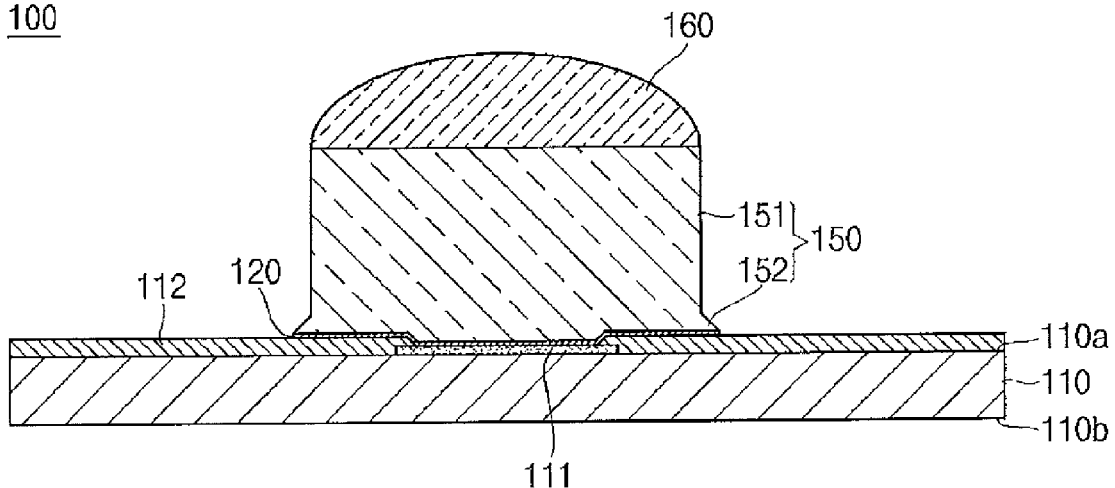
FIG. 1 is a sectional view illustrating a semiconductor device according to an embodiment of the present invention.

Referring to FIG. 1, a semiconductor device 100 according to an embodiment of the present invention is shown. The semiconductor device 100 may include a semiconductor die 110, a seed layer 120, a conductive pillar 150, and a solder layer 160.

The semiconductor die 110 may be made of silicon, and may include a first surface 110a, and a second surface 110b that is substantially planar and opposite to the first surface 110a. The semiconductor die 110 may also include at least one bond pad 111 formed on the first surface 110a. The bond pad 111 may be used to send an electrical signal input and or output to and or from the semiconductor die 110. The bond pad 11 may be electrically coupled to an active region (not shown) of the semiconductor die 110. The bond pad 111 may be made of aluminum. However, the bond pad 111 is not limited thereto and may be formed of other materials without departing from the spirit and scope of the present invention.

The semiconductor die 110 may further include a passivation layer 112 formed on a portion of the first surface 110a. In general, the passivation layer 112 is not applied over a central area of the bond pad 111. However, the passivation layer 112 may be formed over an outer periphery of the bond pad 111. The passivation layer 112 may be made of any one selected from an oxide layer ($SiO_2$), a nitride layer ($Si_3N_4$), equivalents thereof, but aspects of the present invention are not limited thereto.

The seed layer 120 may be formed between the bond pad 111 and the passivation layer 112. As shown in FIG. 1, the seed layer 120 is applied on the exposed areas of the bond pad 11 and over portions of the passivation layer 112 around an outer perimeter of the bond pad 111. The seed layer 120 may be made of at least one selected from the group consisting of titanium (Ti), copper (Cu), nickel (Ni), gold (Au), silver (Ag), aluminum (Al), and equivalents thereof, but aspects of the present invention may not be limited thereto. The seed layer 120 allows the conductive pillar 140 to be plated and firmly attached to the passivation layer 112.

The conductive pillar 150 is formed on the seed layer 120 to a predetermined height. The conductive pillar 150 is a conductive protrusion for connecting the semiconductor device 100 to an external device, such as a printed circuit board, and serves as a bump. In detail, the conductive pillar 150 includes a base portion 151 and a stress relief portion 152.

The base portion 151 has a smaller diameter than the seed layer 120, and plays a main part in electrically connecting the semiconductor die 110 to an external device, such as a printed circuit board.

The stress relief portion 152 is formed as a protrusion extending from the lateral surface of a lower portion of the base portion 151 toward distal ends of the seed layer 120. The stress relief portion 152 relieves stresses applied to contact portions between the conductive pillar 150 and the seed layer 120. Here, the stress relief portion 152 may be formed to have a height gradually decreasing from the lateral surface of the lower portion of the base portion 151 toward the distal ends of the seed layer 120. In addition, the distal ends of the stress relief portion 152 and the distal ends of the seed layer 120 may coincide with each other. A length of the stress relief portion 152 extending from the lateral surface of the base portion 151 may be in a range of 0.1 µm~3 µm, which is suitable for relieving the stresses applied to the distal ends of the contact portions between the conductive pillar 150 and the seed layer 120.

The conductive pillar 150 may include the base portion 151 and the stress relief portion 152 integrally formed with each other, and may be made of at least one selected from the group consisting of copper (Cu), nickel (Ni), gold (Au), silver (Ag), aluminum (Al), and equivalents thereof, but aspects of the present invention may not be limited thereto.

The solder layer 160 is fusibly attached onto the conductive pillar in a substantially spherical shape. The solder layer 160 may transfer electrical signals to and or from the semiconductor die 110 and an external circuit such as a printed circuit board. The solder layer 160 may be made of at least one selected from the group consisting of Sn—Pb, Sn—Pb—Ag, Sn—Pb—Bi, Sn—Cu, Sn—Ag, Sn—Bi, Sn—Ag—Cu, Sn—Ag—Bi, Sn—Zn, and equivalents thereof, but aspects of the present invention are not limited thereto.

As described above, the semiconductor device 100 according to an embodiment of the present invention includes the conductive pillar 150 with the stress relief portion 152, thereby reducing stresses generated at ends of contact portions between the conductive pillar 150 and the seed layer 120. Therefore, the semiconductor device 100 can prevent the conductive pillar 150 and the seed layer 120 from being disconnected from each other due to stress, thereby preventing electrical and mechanical properties thereof from deteriorating.

Figure 2:
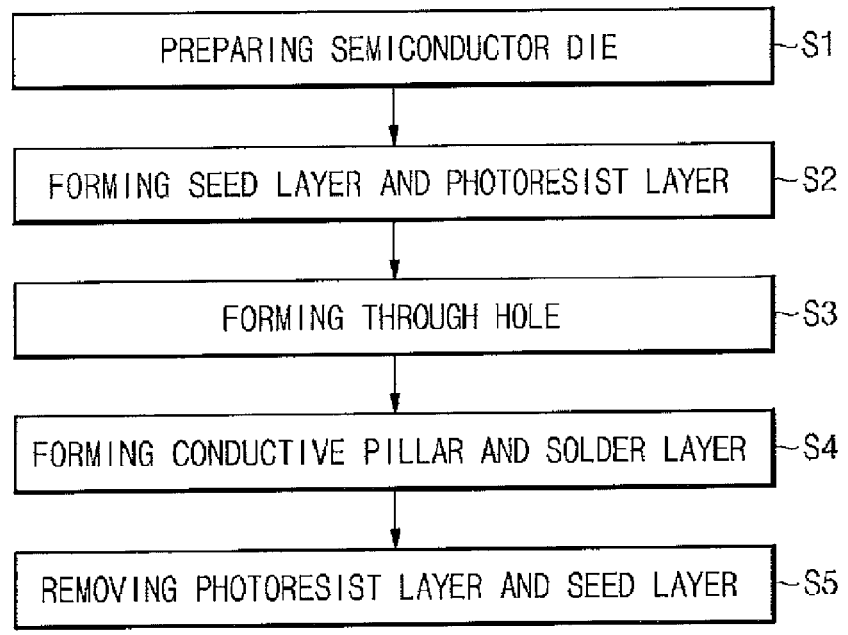
FIG. 2 is a flowchart showing a method for manufacturing a semiconductor device according to an embodiment of the present invention.

Referring to FIG. 2, a flowchart for explaining a method for manufacturing a semiconductor device according to an embodiment of the present invention is illustrated. Referring to FIGS. 3A through 3H, sectional views of various process steps of the manufacturing method of the semiconductor device illustrated in FIG. 2 are sequentially illustrated.

As illustrated in FIG. 2, the method for manufacturing the semiconductor device 100 according to an embodiment of the present invention includes preparing a semiconductor die (S1), forming a seed layer and a photoresist layer (S2), forming a through hole (S3), forming a conductive pillar and a solder layer (S4), and removing a photoresist layer and a seed layer (S5).

Figure 3A:
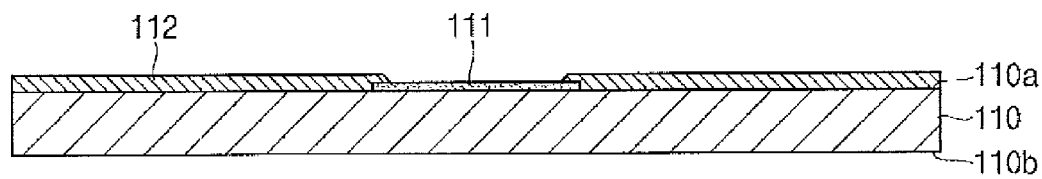
FIGS. 3A through 3H are sectional views sequentially illustrating various process steps of the manufacturing method of the semiconductor device illustrated in FIG. 2.

As illustrated in FIG. 3A, in the preparing of the semiconductor die (S1), the semiconductor die 110 having a first surface 110a that is substantially planar, and a second surface 110b that is substantially planar and opposite to the first surface 110a is prepared, the first surface 110a having at least one bond pad 111 formed thereon. Here, a passivation layer 112 is formed on the first surface 110a excluding a central region corresponding to the bond pad 111. As shown, the passivation layer 112 may cover the outer perimeter of the bond pad 111.

Figure 3B:
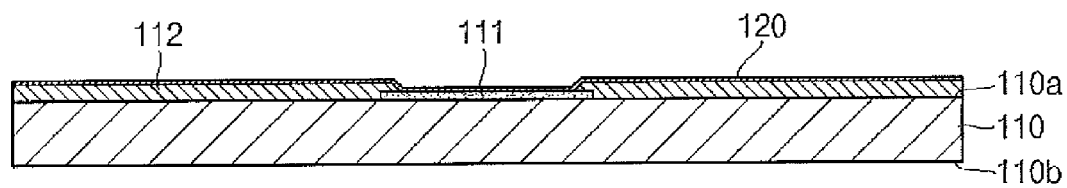
Figure 3C:
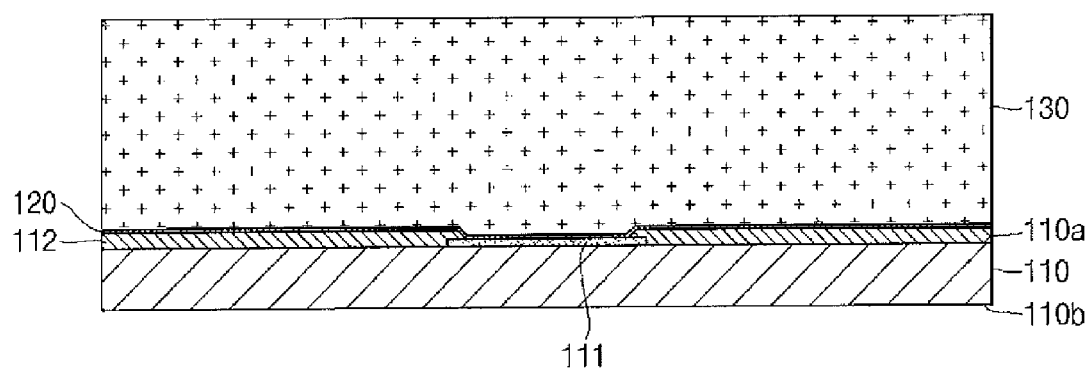

As illustrated in FIGS. 3B and 3C, in the forming of the seed layer 120 and the photoresist layer 130 (S2), the seed layer 120 having a predetermined thickness is formed on the bond pad 111 and the passivation layer 112, and the photoresist layer 130 having a predetermined thickness is then formed on the seed layer 120.

The seed layer 120 may be formed by blanket depositing at least one selected from the group consisting of titanium (Ti), copper (Cu), nickel (Ni), gold (Au), silver (Ag), aluminum (Al), and equivalents thereof, on the bond pad 111 and the passivation layer 112, by sputtering, chemical vapor deposition (CVD), or plasma enhanced chemical vapor deposition (PECVD). However, the seed layer 120 may be formed in other manners without departing from the spirit and scope of the present invention.

The photoresist layer 130 may be formed by adhering a dry film resist to an entire surface of the seed layer 120 by lamination. The dry film resist may be formed by coating a photoresist material on a polyethylene terephthalate (PET) film and adhering a polyethylene (PE) film thereon. The dry film resist may be used for forming high-density, high-integration circuit patterns. The photoresist layer 130 may be formed by other means without departing from the spirit and scope of the present invention.

Figure 3D:
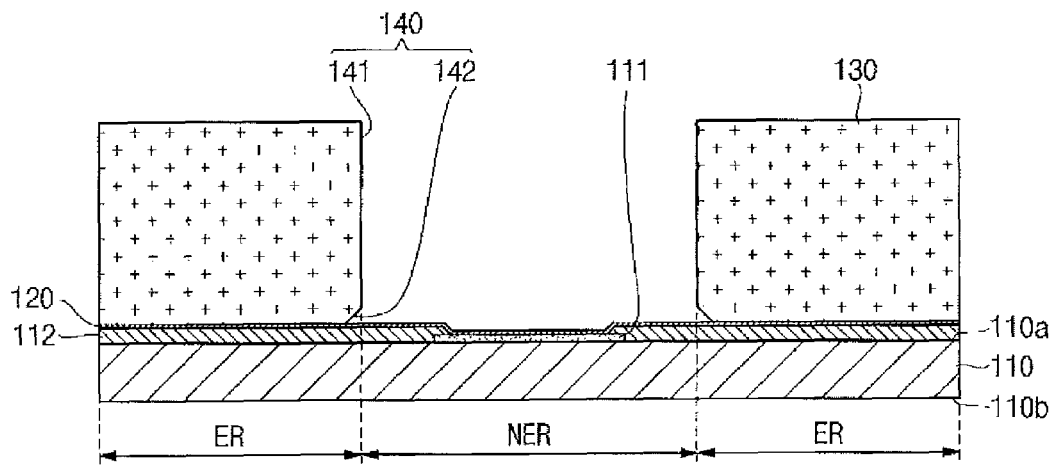

As illustrated in FIG. 3D, in the forming of the through hole (S3), the through hole 140 may include a first through hole 141 and a second through hole 142 is formed on the photoresist layer 130. The through hole 140 may be formed by sequentially performing steps of exposing, developing and baking on the photoresist layer 130. Other means may be used to form the first and second through hole 141 and 142 without departing from the spirit and scope of the present invention.

The first through hole 141 may be formed to expose a region of the seed layer 120 corresponding to the region including the bond pad 111. In detail, the first through hole 141 may be formed by removing a non-exposed region (NER) of the photoresist layer 130, except for an exposed region (ER) of the photoresist layer 130. To this end, the dry film resist used to form the photoresist layer 130 may be a negative-type photoresist. Here, the exposed region (ER) is a region that is exposed to light, while the non-exposed region (NER) is a region that is not exposed to light during the exposing step of the photoresist layer 130. The non-exposed region (NER) is removed using a developing solution during the developing step.

The second through hole 142 may be formed such that it extends from a lateral surface of the lower portion of the first through hole 141 toward the photoresist layer 130. In detail, the second through hole 142 may be formed by additionally removing a partial portion of the exposed region (ER) of the photoresist layer 130 using a developing solution during the developing step, the partial portion being barely exposed to light (that is, the partial portion is a portion where the non-exposed region (NER) and the exposed region (ER) contact with each other in a surface of the seed layer 120).

In accordance with one embodiment, in the exposing step for forming the first through hole 141 and the second through hole 142, the exposed region (ER) of the photoresist layer 130 is exposed to a dose of 30 to 50% of a normal exposure dose for completely transforming the property of the photoresist layer 130. This is to allow the exposed region (ER) of the photoresist layer 130 to be exposed to light to a low dose so that a portion of the exposed region (ER) of the photoresist layer 130 is barely exposed to light. That is to say, the portion of the exposed region (ER) of the photoresist layer 130 that is barely exposed to light is made to be removed by a development solution, thereby forming the second through hole 142. Here, if the exposed region (ER) of the photoresist layer 130 is exposed to a dose of less than 30% that of normal exposure, exposure of the exposed region (ER) of the photoresist layer 130 is not sufficient, most of the exposed region (ER) of the photoresist layer 130 may be undesirably removed during the developing step using the developing solution. If the exposed region (ER) of the photoresist layer 130 is exposed to a dose of greater than 50% that of normal exposure, the cost of the exposing step for forming the second through hole 142 may be greatly increased.

In order to form a through hole on a dry film resist, it is common to sequentially perform exposing, baking and developing steps. In the exemplary embodiment of the present invention, however, in order to facilitate formation of the second through hole 142, the exposing, developing and baking steps are sequentially performed in that order. This is because if the developing step, prior to the baking step is performed in a state in which adhesion of the dry film resist is weak, then the partial portion of the exposed region (ER) of the photoresist layer 130 for forming the second through hole 142 can be more efficiently removed.

Figure 3E:
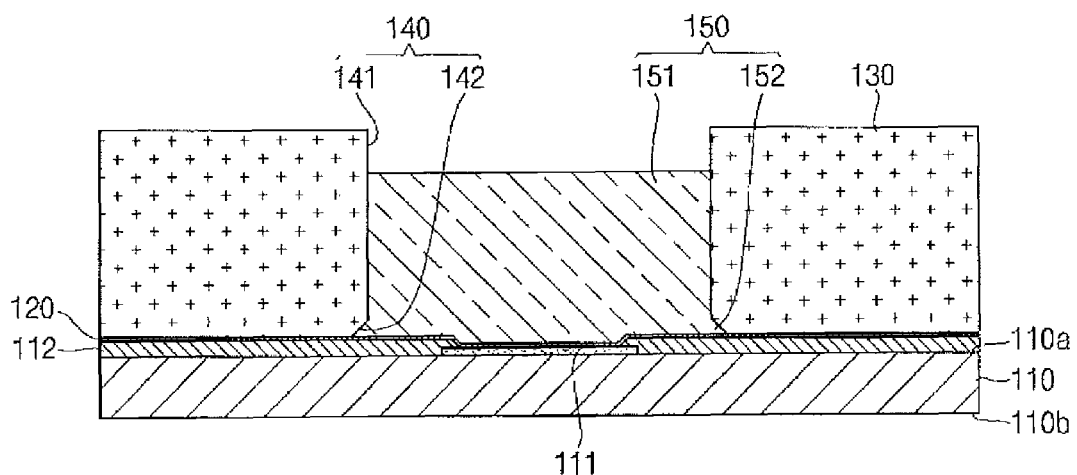
Figure 3F:
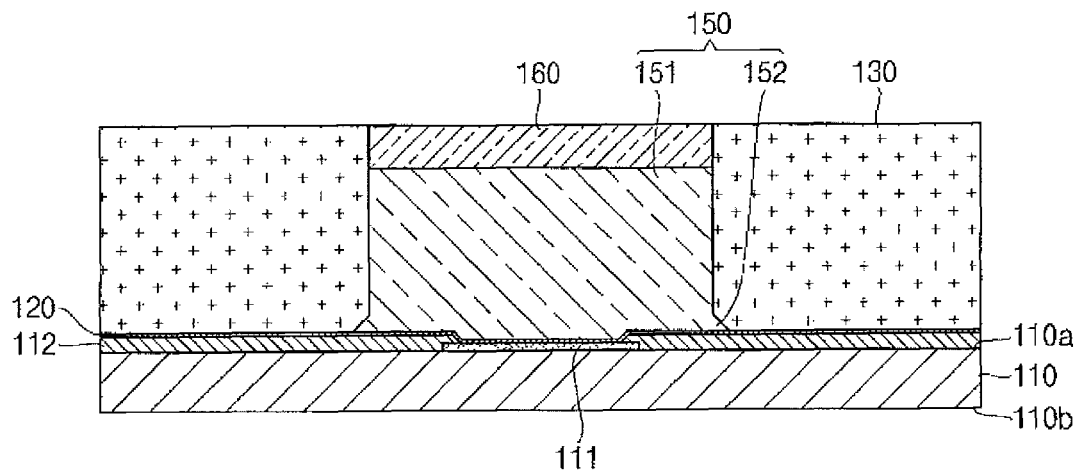

As illustrated in FIGS. 3E and 3F, in the forming of the conductive pillar and the solder layer (S4), the conductive pillar 150 and the solder layer 160 are formed in the through hole 140. The conductive pillar 150 may be formed by filling the through hole 140 with a conductive material by, for example, plating. The conductive pillar 150 may include a base portion 151 formed in the first through hole 141, and a stress relief portion 152 formed in the second through hole 142. A top surface of the base portion 151 may be lower than that of the photoresist layer 130, by which a space in which the solder layer 160 is formed can be provided inside the through hole 140.

Figure 3G:
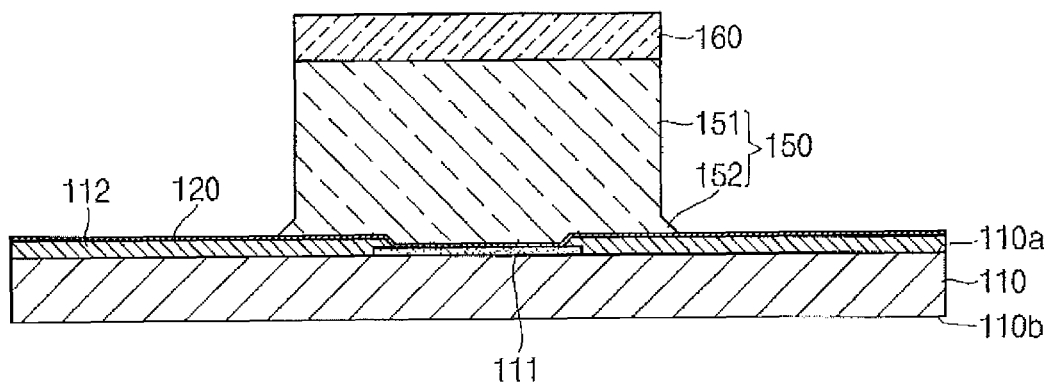

The solder layer 160 is formed on the conductive pillar 150 inside the through hole 140, by, for example, plating. As illustrated in FIG. 3G, in the removing of the photoresist layer and the seed layer (S5), the photoresist layer 130 is completely removed and the seed layer 120 is partially removed. The removing of the photoresist layer 130 may be performed by, for example, stripping. The removing of the seed layer 120 may be performed by, for example, etching. Here, the etching may be performed such that the distal ends of the stress relief portion 152 and the distal ends of the seed layer 120 may coincide with each other. In the removing of the seed layer 120, the stress relief portion 152 may serve as a barrier preventing an overetching of the seed layer 120, thereby preventing the seed layer 120 from caving in toward the base portion 151.

Figure 3H:
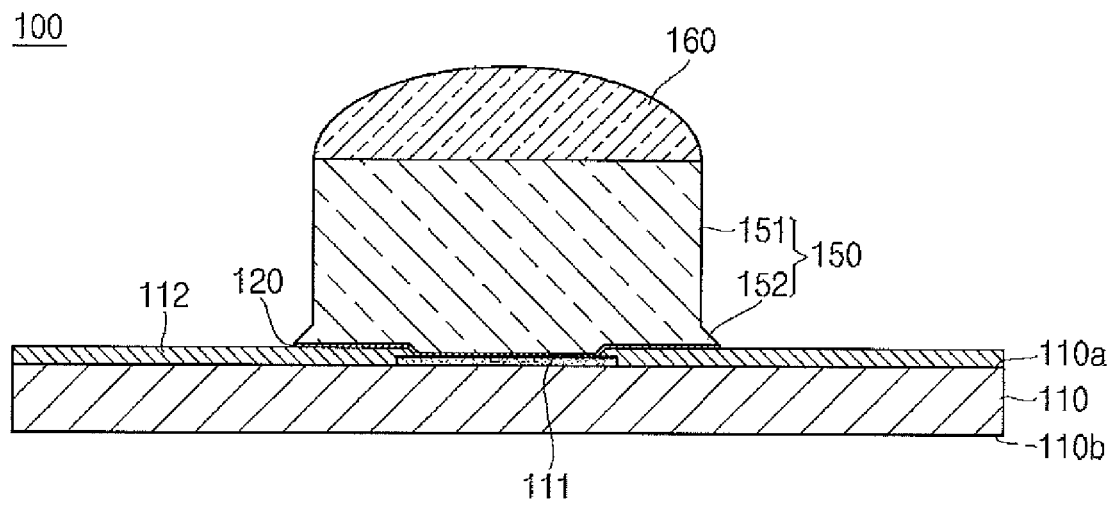

Following the removing of the photoresist layer and the seed layer (S5), the solder layer 160 is reflowed. The reflowing allows the solder layer 160 to be fusibly attached onto the conductive pillar 150 in a substantially spherical shape, as illustrated in FIG. 3H.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method for manufacturing a semiconductor device, the method comprising:
   forming a passivation layer on a first surface of a semiconductor die having at least one bond pad, wherein a central area of the at least one bond pad is exposed;
   forming a seed layer on the passivation layer and the exposed portions of the at least one bond pad;
   forming a photoresist layer on the seed layer;
   forming a first through hole and a second through hole in the photoresist layer, the first through hole formed in the photoresist layer to expose a portion of the seed layer corresponding to a region including the bond pad, and the second through hole extending from a lateral surface of a lower portion of the first through hole toward the photoresist layer;
   forming a conductive pillar by, at least in part, filling the second through hole and at least a portion of the first through hole with a same conductive material;
   forming a solder layer on the conductive pillar; and
   removing the photoresist layer and portions of the seed layer.

2. The method of claim 1, wherein said forming a seed layer comprises forming the seed layer by one of sputtering, chemical vapor deposition (CVD), or plasma enhanced chemical vapor deposition (PECVD).

3. The method of claim 1, wherein said forming a photoresist layer on the seed layer comprises adhering a dry film resist on the seed layer by lamination.

4. The method of claim 1, wherein said forming a first through hole and a second through hole comprises sequentially in-order performing exposing, developing and baking steps on the photoresist layer.

5. The method of claim 4, wherein:
   said forming a first through hole comprises removing a non-exposed region of the photoresist layer, where an exposed region of the photoresist layer remains; and
   said forming a second through hole comprises removing a partial portion of the exposed region of the photoresist layer.

6. The method of claim 5, wherein the exposed region of the photoresist layer is exposed to a dose of 30 to 50% of a normal exposure dose.

7. The method of claim 1, wherein said forming a conductive pillar comprises:
   forming a base portion of the conductive pillar in the first through hole; and
   forming a stress relief portion of the conductive pillar in the second through hole,
   wherein a top surface of the base portion is lower than a top surface of the photoresist layer.

8. The method of claim 7, wherein:
   said removing the photoresist layer comprises stripping the photoresist layer; and
   said removing portions of the seed layer comprises etching the seed layer such that distal ends of the stress relief portion and distal ends of the seed layer coincide with each other.

9. A method for manufacturing a semiconductor device, the method comprising:
   forming a photoresist layer on a seed layer;
   forming a through hole, wherein:
   a first through hole portion extends axially through the photoresist layer and exposes a portion of the seed layer corresponding to a region including a bond pad, where the first through hole portion includes a first end closest to the seed layer and a second end farthest from the seed layer; and a second through hole portion extends radially from the first end of the first through hole portion;

forming a conductive pillar by, at least in part, filling the second through hole portion and at least a portion of the first through hole portion with a same conductive material, and forming a solder layer on the conductive pillar.

10. The method of claim 9, wherein said forming a photoresist layer comprises adhering a dry film resist on the seed layer by lamination.

11. The method of claim 9, wherein said forming a through hole comprises sequentially in-order performing exposing, developing and baking steps on the photoresist layer.

12. The method of claim 9, wherein said forming a through hole comprises:

forming the first through hole portion by, at least in part, removing a non-exposed region of the photoresist layer, where an exposed region of the photoresist layer remains; and forming the second through hole portion by, at least in part, removing a partial portion of the exposed region of the photoresist layer.

13. The method of claim 12, wherein the partial portion of the exposed region of the photoresist layer that is removed to form the second through hole portion is immediately adjacent to the seed layer.

14. The method of claim 12, wherein the partial portion of the exposed region of the photoresist layer that is removed to form the second through hole portion is exposed to a dose of 30 to 50% of a normal exposure dose for the photoresist layer.

15. The method of claim 9, wherein said forming a conductive pillar comprises:

forming a base portion of the conductive pillar in the first through hole portion; and forming a stress relief portion of the conductive pillar in the second through hole portion, wherein a top surface of the base portion is lower than a top surface of the photoresist layer.

16. The method of claim 9, comprising:

removing the photoresist layer by, at least in part, stripping the photoresist layer; and removing portions of the seed layer by, at least in part, etching the seed layer such that distal ends of the stress relief portion and distal ends of the seed layer coincide with each other.

17. A method for manufacturing a semiconductor device, the method comprising:

forming a conductive pillar on a seed layer above a bond pad, where the conductive pillar extends in an axial direction of the seed layer and the bond pad, said forming a conductive pillar comprising:

forming a base portion of the conductive pillar;

integrally forming a stress relief portion of the conductive pillar with the base portion of the conductive pillar with a same conductive material as that of the base portion, wherein:

the stress relief portion of the conductive pillar is axially adjacent to the seed layer; and the stress relief portion of the conductive pillar extends radially outward from the base portion of the conductive pillar, and forming a solder layer on the conductive pillar.

18. The method of claim 17, wherein said forming a conductive pillar comprises forming the conductive pillar in a cavity that extends axially from the bond pad, wherein:

a first end of the cavity that is axially farthest from the bond pad extends radially outward a first amount in a first radial direction; and a second end of the cavity that is axially closest to the bond pad extends radially outward in the first radial direction a second amount that is greater than the first amount.

19. The method of claim 18, wherein the cavity is a cavity in a photoresist layer.

20. The method of claim 19, comprising forming the cavity in the photoresist layer by, at least in part:

forming a first cavity portion by, at least in part, removing a non-exposed region of the photoresist layer, where an exposed region of the photoresist layer remains; and forming a second cavity portion by, at least in part, removing a partial portion of the exposed region of the photoresist layer.

* * * * *